(12) United States Patent
Yang et al.

(10) Patent No.: US 6,489,012 B1
(45) Date of Patent: Dec. 3, 2002

(54) PRINTED CIRCUIT BOARD FOR RAMBUS

(75) Inventors: Deok Jin Yang, Chungchongbuk-do (KR); Keon Yang Park, Seoul (KR); Byong Ho Lee, Taejon kwangyok-si (KR); Yang Je Lee, Chungchongbuk-do (KR); Myong Gun Chong, Chungchongnam-do (KR)

(73) Assignee: Samsung Electro-Mechanics Co., LTD (KR)

( * ) Notice: Subject to any disclaimer, the term of this patent is extended or adjusted under 35 U.S.C. 154(b) by 0 days.

(21) Appl. No.: 09/693,286

(22) Filed: Oct. 20, 2000

(30) Foreign Application Priority Data

Oct. 20, 1999 (KR) .............................. 99-45520
Oct. 22, 1999 (KR) .............................. 99-46059

(51) Int. Cl.⁷ ................................................ B32B 3/00
(52) U.S. Cl. ..................... 428/209; 428/901; 174/251; 174/255
(58) Field of Search ............................ 428/209, 901; 174/250, 255, 251

(56) References Cited

U.S. PATENT DOCUMENTS 3,958,317 A * 5/1976 Peart et al. ................ 428/209
5,362,534 A * 11/1994 McKenney et al. ............ 428/40
5,633,072 A * 5/1997 Middelman et al. ........ 428/209
5,739,476 A * 4/1998 Namgung .................... 174/255
6,103,977 A * 8/2000 Namgung .................... 174/255
6,197,425 B1 * 3/2001 Sekimoto et al. ........... 428/209

* cited by examiner

Primary Examiner—Cathy Lam
(74) Attorney, Agent, or Firm—Renner, Otto, Boisselle & Sklar, LLP

(57) ABSTRACT

A printed circuit board for high speed processing devices such as RAMBUS is disclosed. Adhesive means are interposed between a plurality of both-face copper clad laminates, and each of the adhesive means consists of a clad laminate and prepreg layers formed on both faces of the clad laminate. The sum total of the thicknesses of the clad laminates and the prepreg layers is smaller than that of the conventional printed circuit board. Therefore, when carrying out a pressing to attach the copper foils, the thickness deviations are decreased compared with the conventional case, and therefore, the occurrence of impedance defects can be prevented.

17 Claims, 5 Drawing Sheets

PRINTED CIRCUIT BOARD FOR RAMBUS

BACKGROUND OF THE INVENTION

1. Field of the Invention

The present invention relates to a printed circuit board. Particularly, the present invention relates to a printed circuit board for a high speed processing, in which a plurality of both-face copper clad laminates with circuits formed thereon, and a plurality of clad laminates with circuits not formed thereon are alternately stacked together, whereby impedance defects due to the non-uniformity in the inter-layer insulating distances are eliminated.

2. Description of the Prior Art

Recently, there has been developed the RAMBUS DRAM which shows a transmission rate 10 times as fast as that of the existing high speed synchronous DRAM. This RAMBUS DRAM is mostly used in electronic apparatuses requiring a large capacity graphic memory such as work stations, personal computers, digital televisions and the like. In this RAMBUS DRAM, the bank interleaving function is adopted, and therefore, the data processing capability is drastically improved. Thus it is expected that this RAMBUS DRAM will be used as the main memory of the personal computer as well as the graphic memory.

This RAMBUS DRAM shows not only a high operating speed compared with other kinds of DRAM, but also a large transmission rate. For example, the 144M RAMBUS DRAM which is the concurrent version shows an operating speed of 700–800 M Hz and a transmission rate of 700 M bytes. If this is compared with other kinds of DRAM, the EDO (extended data-out) DRAM shows a transmission rate of 80M bytes, and the synchronous DRAM shows a transmission rate of 133M bytes, while the SGRAM (synchronous graphic RAM) shows a transmission rate of 400M bytes. Thus it is seen that the RAMBUS DRAM gives a large capacity transmission rate.

The RAMBUS DRAM has the prerequisite that it has to transmit a largest amount of data within a shortest period of time. If a large amount of data is to be transmitted at a high speed, the designed impedance of the component has to be matched with the designed impedance of the printed circuit board. If they are not matched to each other, then the signals are reflected, and time delay occurs in transmitting the signals, with the result that an accurate transmission is not realized, thereby making it impossible to carry out a high speed transmission. Accordingly, in manufacturing a printed circuit board for use in a communication equipment or the like, it is an important matter that the impedance of the circuit board be exactly controlled.

FIG. 1 illustrates the structure of the conventional multi-layer printed circuit board which is used for a high speed processing device such as RAMBUS DRAM. As shown in the drawing, the printed circuit board consists of 8 layers. As shown in the drawing, in the structure of this conventional printed circuit board, a first copper clad laminate 1 has a copper foil on each of the both faces, and the copper foils are etched to form circuits 3 and 5. A first adhesive layer 7 is disposed on the top face of the first copper clad laminate 1, and a second adhesive layer 9 is disposed on the bottom face of the laminate 1. The first adhesive layer 7 and the second adhesive layer 9 are made of prepreg. Then a second copper clad laminate 11 and a third copper clad laminate 15 are stacked on the top face and on the bottom face of the above structure, and then, a pressure is applied, so that the second copper clad laminate 11 and a third copper clad laminate 15 can be attached onto the first copper clad laminate 1.

Like the first copper clad laminate 1, the second and third copper clad laninate 11 and 15 are made to respectively have circuits 12, 13, 16 and 17 on both faces of them, which are formed by etching the copper foils of the both faces of them.

On the outer faces of the second and third copper clad laminates 11 and 15, there are respectively stacked a third adhesive layer 20 and a fourth adhesive layer 24 with a copper foil attached on each of them, and then, a pressure is applied on them, so that the copper foils would be attached onto the third and fourth adhesive layers 20 and 24. These copper foils are also etched to form circuits 21 and 25 on the third and fourth adhesive layers 20 and 24.

In the above printed circuit board, when the copper foils are attached on the insulating sheets, the copper foils and the insulating sheets are pressed together, thereby manufacturing the circuit board. Generally, a plurality of the printed circuit boards are manufactured in a single panel. At the most, 24 printed circuit boards are manufactured in a single panel. The pressing is carried out with a plurality of the panels stacked together. That is, under a vacuum within a vacuum chamber, the stacked panels are heated and pressed together.

Each of the circuit board panels has an area much larger than that of the printed circuit board. The prepreg which constitutes the adhesive layers is made of a glass fiber and an epoxy resin, and therefore, has a flow property. Accordingly, when the copper foils are attached onto the circuit board panels by applying a pressure, even if a uniform pressure is applied, a thickness difference occurs between the central portion and the peripheral portions due to the flowing property of the prepreg. This thickness difference remains after the manufacture of the printed circuit boards are completed. Accordingly, when the copper foils are etched to form circuits, insulating distance differences are formed between the copper foils, with the result that the impedance control for the printed circuit board becomes difficult.

SUMMARY OF THE INVENTION

The present invention is intended to overcome the above described disadvantages of the conventional technique.

Therefore it is an object of the present invention to provide a printed circuit board for a high speed processing, in which a plurality of both-face copper clad laminates with circuits formed thereon, and a plurality of clad laminates with circuits not formed thereon are alternately stacked together, whereby, when applying a pressure to attach copper foils, impedance defects due to the non-uniformity in the inter-layer insulating distances are eliminated.

It is another object of the present invention to provide a printed circuit board for a high speed processing, in which on both of the outermost faces of a structure consisting of copper clad laminate with adhesive layers interposed therebetween, there are formed thinner copper clad laminates, whereby, when pressing the stacked structure, impedance defects due to the non-uniformity in the inter-layer insulating distances are eliminated.

In achieving the above objects, the printed circuit board for a high speed processing according to the present invention includes: a plurality of copper clad laminates with copper foils attached on both faces thereof and with circuit formed at least on one faces thereof by etching; a plurality of copper non-clad laminates with copper foils on neither of their faces; and a plurality of adhesive means such as adhesive layers spread on faces of the copper non-clad laminates.

On outermost ones of the copper clad laminates, there are disposed either adhesive layers with circuits formed thereon, or there are disposed both-face copper clad laminates with circuits formed thereon.

Generally, the adhesive layers of the adhesive means are thinner than the both-face copper clad laminates, and therefore, when pressing the laminate structure, the thickness deviations can be decreased, thereby preventing impedance defects.

In another aspect of the present invention, the printed circuit board for a high speed processing according to the present invention includes: a plurality of copper clad laminates with copper foils attached on both faces thereof, with circuit formed at least on one faces thereof, and with adhesive layers interposed between the copper clad laminates; a pair of thinner adhesive layers spread on outermost faces of the copper clad laminates; and a pair of one-face copper clad laminates with circuits formed on copper foils and attached on the thinner adhesive layers.

Accordingly, compared with the general printed circuit board in which the circuits are formed directly on the adhesive layers, the thickness of the outermost adhesive layers is reduced, and therefore, the thickness deviations can be decreased when pressing the copper clad laminate structure.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENT

Figure 1:
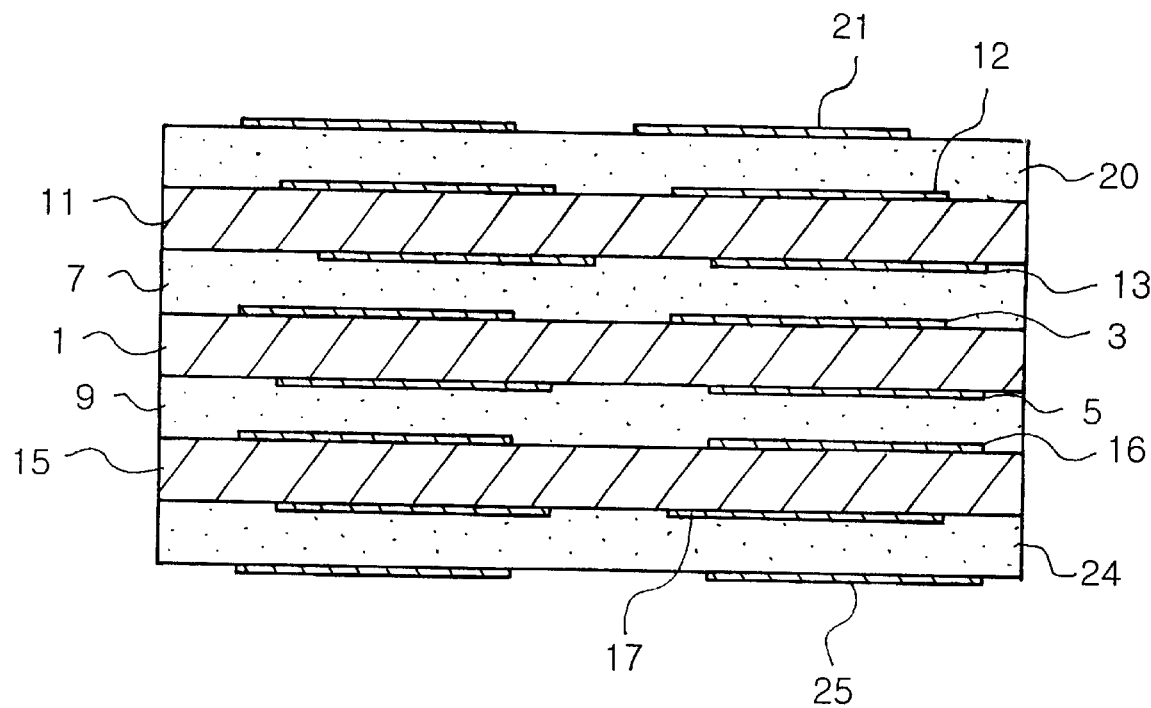
FIG. 1 illustrates the structure of the conventional multi-layer printed circuit board which is used for a high speed processing device.
Figure 2:
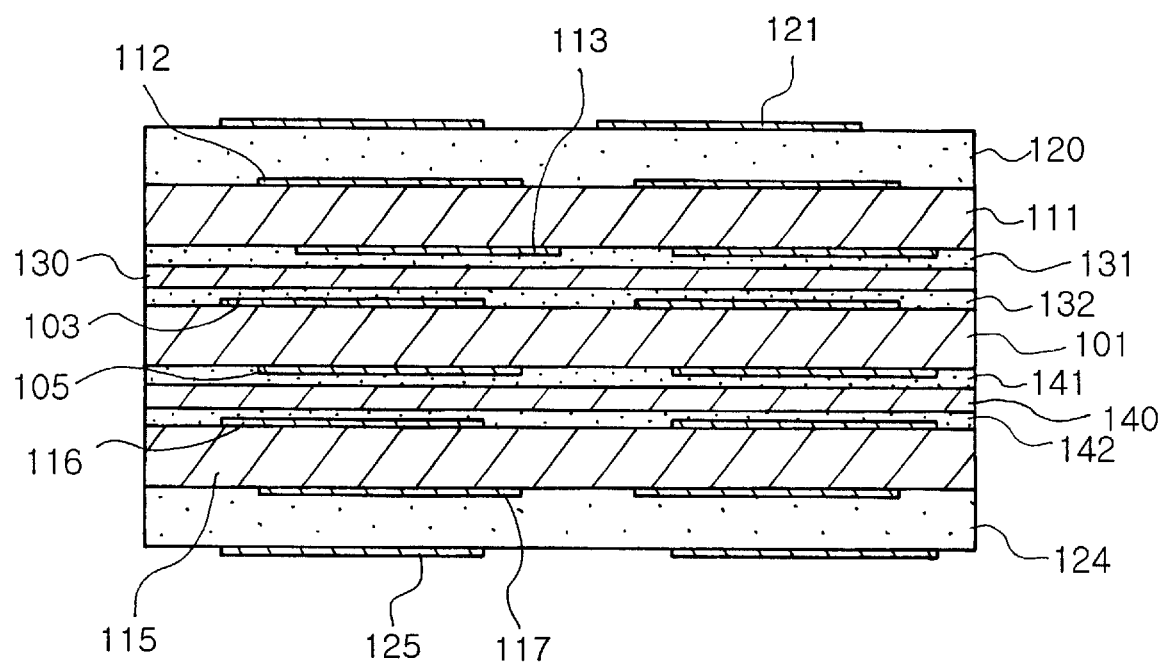
FIG. 2 illustrates the structure of an in-core type printed circuit board for a high speed processing as a first embodiment of the present invention.

FIG. 2 illustrates the structure of an in-core type printed circuit board for a high speed processing as a first embodiment of the present invention. This printed circuit board includes 8 layers. As shown in the drawing, the structure of this printed circuit board is similar to that of the conventional printed circuit board of FIG. 1. That is, copper foils which are clad on both faces of three copper clad laminates 101, 111 and 115 are etched to form circuits 103, 105, 112, 113, 116 and 117. The both-face copper clad laminates 101, 111 and 115 are press-attached together. Adhesive layers 120 and 124 which are made of prepreg are stacked on outer faces of the uppermost and lowermost copper clad laminates 111 and 115 respectively so as to form outermost adhesive layers. Copper foils are disposed on the outermost adhesive layers, and are etched to form circuits 121 and 125.

The printed circuit board like the above described one in which at least one both-face copper clad laminate is disposed at the inside, and the outermost insulating layers are made of prepreg is called "in-core type. The reason why it is called so is that the copper clad laminate as the core is positioned inside, while the outside portions are made of prepreg.

The difference between the printed circuit of FIG. 2 and the conventional printed circuit of FIG. 1 lies in the adhesive means which bonds the copper clad laminates together. That is, in the conventional printed circuit of FIG. 1, adhesive layers made of prepreg are stacked between the copper clad laminates, while in the present invention, the adhesive means are of a complex structure.

In other words, adhesive layers 131, 132, 141 and 142 made of prepreg are stacked respectively on both faces of clad laminates 130 and 140 on which copper foils have been removed or have not been put. Then these complex structures are interposed respectively between the copper clad laminates. In the present invention, for the sake of describing convenience, the layers on which copper foils are attached and circuits are formed will be called "copper clad laminates", while the layers on which copper foils are not attached will be called "clad laminates". Therefore, the clad laminates which are mentioned in the description and in the appended claims refer to the laminates on which copper foils are not attached.

These clad laminates can be prepared by removing the copper foils from the copper clad laminates, or by putting a film on each of both faces of an inside sheet and by heating and pressing them.

The adhesive means which consist of prepreg and the clad laminates are interposed between the copper clad laminates 101, 111 and 115, and this structure is pressed together. Thus the outermost copper foils are attached onto the adhesive layers 120 and 124. Then the copper foils are etched to form circuits 121 and 125.

The thickness of the clad laminates 130 and 140 may be different depending on the requisite of the apparatus. Further, the thickness of the adhesive layers 131, 132, 141 and 142 which are stacked on the clad laminates 130 and 140 maybe adjusted depending on the use of the printed circuit board. If the thickness of the adhesive layers is reduced during the pressing, then the adhesive means which consist of the clad laminates and the prepreg are made to have a thickness same as that of the conventional adhesive layer. Under this condition, in the drawing, it looks like that the thickness of the clad laminates 130 and 140 is almost same as that of the adhesive layers 131, 132, 141 and 142. However, in the actual printed circuit board, the ratio of the clad laminate to the adhesive layers, that is, the ratio of the clad laminate 130 to the adhesive layers 131 and 132, and the ratio of the clad laminate 140 to the adhesive layers 141 and 142 may be preferably 7:3 to 6:4. These ratios are not inflexible, but may be varied in accordance with the kind of the product.

When carrying out a pressing to attach the copper foils, the thickness of the adhesive layers 120, 124, 131, 132, 141 and 142 is reduced. That is, generally the copper clad laminates have been pressed by the manufacturing company, and are procured as completed components. Therefore, when applying the pressure, their thickness is not reduced. Accordingly, when applying the pressure, the thickness is reduced only in the adhesive layers. However, the thickness of the adhesive layers 131, 132, 141 and 142 of the adhesive means for attaching the copper clad laminates 101, 111 and 115 in the present invention is smaller than the thickness of the adhesive layers of the conventional printed circuit board.

Therefore, when pressing the copper clad laminates and the adhesive layers, the magnitude of the reduction of the thickness is lower in the present invention compared with the conventional ones. As a result, the thickness deviations due to the flowing property of the prepreg are decreased, and therefore, the occurrence of the impedance defects can be prevented.

Figure 3:
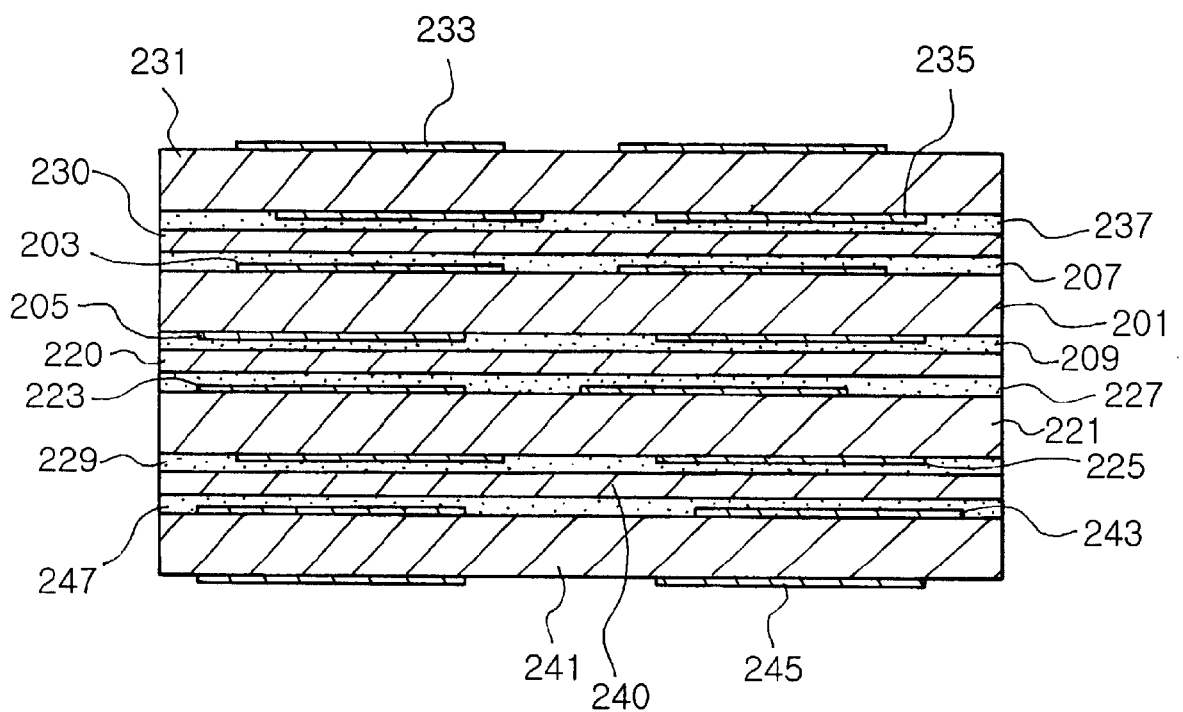
FIG. 3 illustrates the structure of an out-core type printed circuit board for a high speed processing as a second embodiment of the present invention.

FIG. 3 illustrates the structure of a printed circuit board for a high speed processing as a second embodiment of the present invention. The printed circuit board shown in this drawing is an out-core type printed circuit board. The reason why this circuit board is called an out-core type is that the outermost insulating layers are both-face copper clad laminates 231 and 241 as shown in the drawing. In this embodiment, the inner insulating layers are also both-face copper clad laminates 201 and 221. The both-face copper clad laminates 201, 221, 231 and 241 respectively have copper foils which are etched to form circuits 207, 209, 227, 229, 233, 235, 243 and 245.

In the case where the printed circuit board is an out-core type, and in the case of an 8-layer printed circuit board, three adhesive means are required to attached the both-face copper clad laminates 201, 221, 231 and 241. If this is compared with the in-core type printed circuit board which has four adhesive means, the number of the adhesive means is smaller. Thus, with the number of the adhesive means being reduced, when pressing together the stacked layers, the magnitude of the reduction of the thickness in the insulating layers is reduced. Thus even if the thickness deviations occur in the insulating layers due to the flowing property of the prepreg, the magnitude of the deviations is significantly reduced compared with the conventional printed circuit board.

The adhesive means of this embodiment is same as that of FIG. 2. That is, clad laminates 220, 230 and 240 are disposed in the inside, while adhesive layers 209, 227, 207, 237, 229 and 247 made of prepreg are stacked on them. The clad laminates 220, 230 and 240 are much thinner that the both-face copper clad laminates 201, 221, 231 and 241. The adhesive layers 209, 227, 207, 237, 229 and 247 also have a reduced thickness. Therefore, when carrying out a pressing, the magnitude of the reduction of the thickness is very much decreased, with the result that the thickness deviations are greatly decreased.

Figure 4:
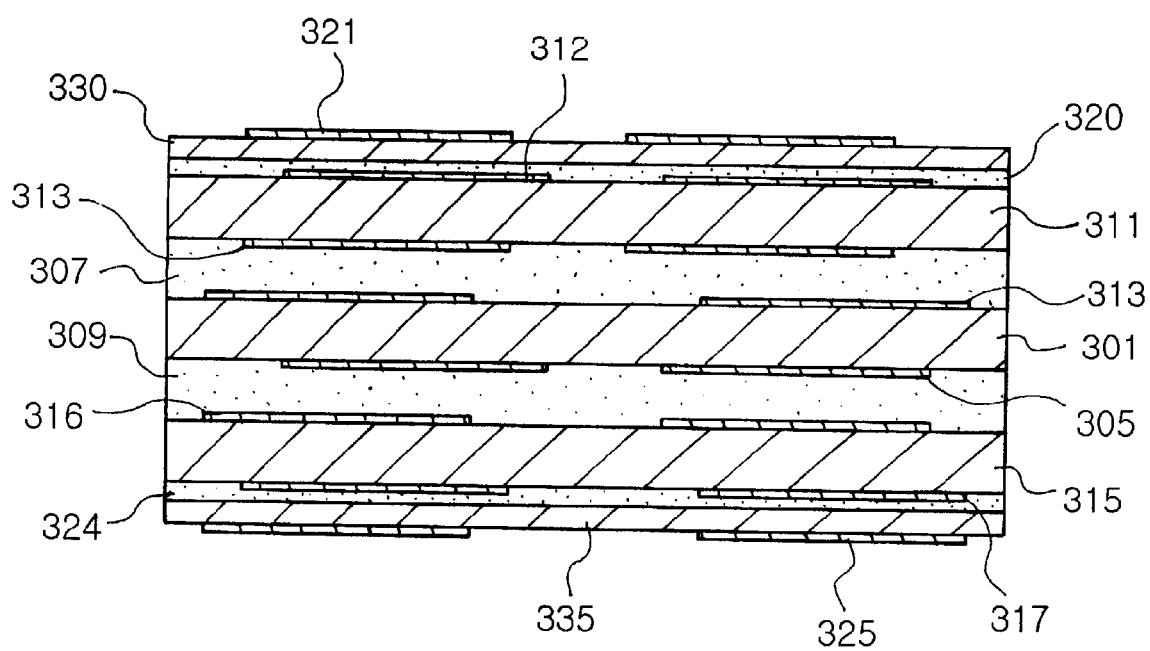
FIG. 4 illustrates the structure of a printed circuit board for a high speed processing as a third embodiment of the present invention.

FIG. 4 illustrates the structure of a printed circuit board for a high speed processing as a third embodiment of the present invention. In this embodiment as shown in the drawing, three both-face copper clad laminates 301, 311 and 315 are press-attached together, with adhesive layers 307 and 309 being interposed between them respectively. In other words, the first adhesive layer 307 is interposed between the first both-face copper clad laminate 301 and the second both-face copper clad laminate 311. The second adhesive layer 309 is interposed between the first both-face copper clad laminate 301 and the third both-face copper clad laminate 315. Then a pressing is carried out to attach together the both-face copper clad laminates 301, 311 and 315. This embodiment is different from the first and second embodiments in that one-face copper clad laminates are included in the adhesive means which bond the both-face copper clad laminates 301, 311 and 315.

In this embodiment, however, the adhesive layers 320 and 324 are respectively stacked on the second and third both-face copper clad laminates 311 and 315, and thereon, there are stacked respectively one-face copper clad laminates 330 and 335. The one-face copper clad laminates 330 and 335 are etched to form outermost circuits 233 and 245. The adhesive layers 320 and 324 which attach the one-face copper clad laminates 330 and 335 to the both-face copper clad laminates 311 and 315 have a thickness much smaller than that of the adhesive layers 307 and 309 which attach the both-face copper clad laminates 301, 311 and 315 together. However, the thickness of the former can be varied depending on the kind of the product. Further, the thickness of the one-face copper clad laminates 330 and 335 is not limited to a certain value, but can be varied depending on the kind of the product.

The one-face copper clad laminates 330 and 335 can be prepared by removing the copper foil of one face from the both-face copper clad laminates or by putting the copper foil only on one face of the laminate. For the sake of the describing convenience, the copper clad laminate in which only one face is attached with copper foil is called "one-face copper clad laminate".

In the case where printed circuit boards having the same characteristics are manufactured, when the manufacture of the product are completed by carrying out the pressing, the products have to have the following characteristics. That is, even in the case where the one-face copper clad laminates 330 and 335 are formed like in the above example, the thickness of the outermost insulating layers has to be same as that of the conventional printed circuit board in which the adhesive layers are made of prepreg only. This is meant that, when the printed circuit boards of the same characteristics are manufactured, the prepreg layers are made thinner than that of the conventional printed circuit board. Accordingly, when carrying out the pressing to attach the one-face copper clad laminates 330 and 335 to the both-face copper clad laminates 311 and 315, the magnitude of the reduction of the prepreg thickness (i.e., the thickness of the adhesive layers 320 and 324) is decreased compared with the conventional printed circuit board. Such a decrease in the reduction of the thickness of the adhesive layers 320 and 324 leads to a decrease in the thickness deviations which occur in the adhesive layers 320 and 324 when pressing them. As a result, the impedance defects due to the deviations of the insulating distance can be prevented.

When the manufacture of the printed circuit board is completed by carrying out the pressing, the sum total of the thicknesses of the one-face copper clad laminates and the adhesive layers can be different depending on the characteristics of the printed circuit board. Further, the ratio of the thickness of the one-face copper clad laminates 330 and 335 to that of the adhesive layers 320 and 324 maybe different depending on the characteristics of the product, but, for example, in the case of the printed circuit board for RAMBUS, the ratio should be preferably 7:3 to 6:4.

Figure 5:
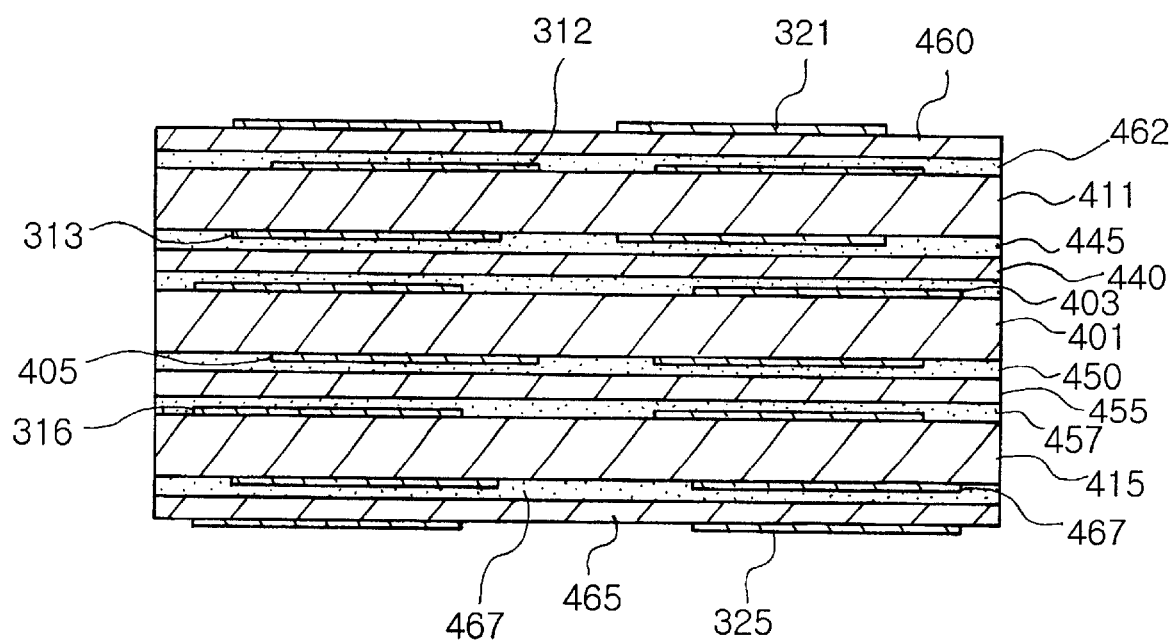
FIG. 5 illustrates the structure of a printed circuit board for a high speed processing as a fourth embodiment of the present invention.

FIG. 5 illustrates the structure of a printed circuit board for a high speed processing as a fourth embodiment of the present invention. As shown in the drawing, the structure of the printed circuit board of this embodiment is basically similar to that of FIG. 4. That is, three both-face copper clad laminates 401, 411 and 415 are disposed in the inside, while adhesive layers 462 and 467 and one-face copper clad laminates 460 and 465 are stacked respectively on the upper and lower both-face copper clad laminates 411 and 415. The thicknesses of the one-face copper clad laminates 460 and 465 and the adhesive layers 462 and 467 are smaller than those of the both-face copper clad laminates and the interposed adhesive layers. Therefore, when carrying out the pressing, the occurrence of the thickness deviations can be prevented.

The difference between the present embodiment and the embodiment of FIG. 4 lies in the attachment means for the both-face copper clad laminates 401, 411 and 415. That is, in the printed circuit board of FIG. 4, the adhesive means which are interposed between the both-face copper clad laminates consist of only the adhesive layers, while in the present embodiment as shown in FIG. 5, the attachment means consist of: clad laminates 4450 and 455 without having any copper foil on either face of them, and adhesive layers 445, 447, 450 and 457 made of prepreg and stacked on the clad laminates 440 and 455 respectively.

The thicknesses of the clad laminates 440 and 455 and the adhesive layers 445, 447, 450 and 457 can be made different depending on the characteristics of the printed circuit board. However, in the case of the printed circuit board for RAMBUS, the ratio of the former to the latter should be preferably 7:3 to 6:4. Further, the thicknesses of the one-face copper clad laminates 460 and 465 and the adhesive layers 462 and 467 can be variously designed depending on the characteristics of the product.

In this embodiment, the one-face copper clad laminates 460 and 465 and the adhesive layers 462 and 467 (which have a smaller thickness compared with the former) are stacked on the both-face copper clad laminates 422 and 415. Therefore, when carrying out the pressing, the thickness deviations can be decreased, and consequently, the impedance defects can be prevented. Further, the adhesive layers 445, 447, 450 and 457 which are interposed between the both-face copper clad laminates 401, 411 and 415 have a thickness much smaller than that of the adhesive layers of the conventional printed circuit board. Therefore, when carrying out the pressing, the magnitude of the reduction of the thickness is decreased in the present invention, and therefore, the thickness deviations are decreased, so that the impedance adjustment can be rendered easier.

In the above descriptions, it is assumed that the printed circuit board consists of 8 layers. However, it is not limited to only 8 layers. It will be apparent to those ordinarily skilled in the art that the printed circuit boards of more than 8 layers and less than 8 layers come within the scope of the present invention. It is required that the impedance deviations should be decreased more according as the electronic apparatuses progress toward higher speeds.

According to the present invention as described above, the adhesive means consist of clad laminates without having copper foils on either face of them, and prepreg sheets stacked on both faces of them. Therefore, when carrying out the pressing to attach the copper clad laminates together, the magnitude of the thickness deviations due to the flowing property of the prepreg is decreased. Further, the thickness deviations are more decreased by making the outermost layers of the printed circuit board consist of prepreg layers and one-face copper clad laminates. Accordingly, in the case where the printed circuit board for ultra-high speed processing devices such as RAMBUS is manufactured, the impedance defects due to the thickness deviations can be prevented.

What is claimed is:

1. A printed circuit board comprising:
   a plurality of both-face copper clad laminates, with at least one copper foil etched to form a circuit on each of said laminates;
   at least one adhesive means interposed between a respective pair of said plurality of both-face copper clad laminates, each adhesive means including a clad laminate and first adhesive layers stacked on the clad laminate of the respective first adhesive means; and
   second adhesive layers stacked on respective cuter surfaces of said plurality of both-face copper clad laminates, and a circuit being formed on each of said second adhesive layers;
   wherein said clad laminate of each adhesive means has a thickness smaller than that of said both-face copper clad laminates.

2. The printed circuit board as claimed in claim 3, wherein a thickness ratio of said clad laminate of each adhesive means to said first adhesive layers is 7:3 to 6:4.

3. A printed circuit board comprising:
   a plurality of both-face copper clad laminates, with at least one copper foil etched to form a circuit on each of said laminates; and
   at least one adhesive means including a clad laminate and adhesive layers stacked on each of said clad laminate, and interposed between a respective pair of said both-face copper clad laminates to attach them together;
   wherein said clad laminate of said adhesive means has a thickness smaller than that of said both-face copper clad laminates.

4. A printed circuit board comprising:
   a plurality of both-face copper clad laminates, with at least one copper foil etched to form a circuit on each of said laminates; and
   at least one adhesive means including a clad laminate and adhesive layers stacked on each of said clad laminate, and interposed between a respective pair of said both-face copper clad laminates to attach them together;
   wherein a thickness ratio of said clad laminate of said adhesive means to said adhesive layers is 7:3 to 6:4.

5. A printed circuit board comprising:
   a plurality of both-face copper clad laminates, with at least one copper foil etched to form a circuit on each of said laminates;
   first and second adhesive layers interposed between said both-face copper clad laminates;
   clad laminates interposed between said first and second adhesive layers, having a thickness smaller than that of said both-face copper clad laminates, and having no copper foil on either face of said clad laminates;
   at least one or more of third and fourth adhesive layers formed on outermost ones of said both-face copper clad laminates, and having a thickness larger than that of said first and second adhesive layers; and
   circuits respectively formed on said third and fourth adhesive layers.

6. A printed circuit board comprising:
   a plurality of both-face copper clad laminates, with at least one copper foil etched to form a circuit on each of said laminates;
   first and second adhesive layers interposed between said both-face copper clad laminates; and
   clad laminates interposed between said first and second adhesive layers, having a thickness smaller than that of said both-face copper clad laminates, and having no copper foil on either face of them.

7. A printed circuit board comprising:
   a plurality of both-face copper clad laminates, with at least one copper foil etched to form a circuit on each of said laminates;
   at least first adhesive layers interposed between said both-face copper clad laminates to attach said both-face copper clad laminates together; and
   an insulating means stacked on the plurality of said both-face copper clad laminates, including one-face copper clad laminates having a circuit thereon and second adhesive layers respectively stacked on a non-circuit face of the one-face copper clad laminates.

8. The printed circuit board as claimed in claim 7, wherein said first adhesive layers are made of prepreg.

9. The printed circuit board as claimed in claim 7, wherein said second adhesive layers are made of prepreg.

10. The printed circuit board as claimed in claim 7, wherein said one-face copper clad laminates have a thickness smaller than that of said both-face copper clad laminates.

11. The printed circuit board as claimed in claim 10, wherein a thickness ratio of said clad laminates to said second adhesive layers is 7:3 to 6:4.

12. The printed circuit board as claimed in claim 7, wherein said second adhesive layers have a thickness smaller than that of said first adhesive layers.

13. A printed circuit board comprising:
  a plurality of both-face copper clad laminates, with at least one copper foil etched to form a circuit on each of said laminates;
  at least one adhesive means respectively including clad laminates and first adhesive layers stacked on both faces of each of said clad laminates to attach said both-face copper clad laminates together; and
  an insulating means stacked on the plurality of said both-face copper clad laminates, including one-face copper clad laminates having a circuit thereon and second adhesive layers respectively stacked on a non-circuit face of the one-face copper clad laminates.

14. The printed circuit board as claimed in claim 13, wherein said first adhesive layers are made of prepreg.

15. The printed circuit board as claimed in claim 14, wherein said second adhesive layers are made of prepreg.

16. The printed circuit board as claimed in claim 13, wherein said one-face copper clad laminates have a thickness smaller than that of said both-face copper clad laminates.

17. The printed circuit board as claimed in claim 13, wherein a thickness ratio of said one-face copper clad laminates to said second adhesive layers is 7:3 to 6:4.

* * * * *